US007979754B2

United States Patent
Drost et al.

(10) Patent No.: US 7,979,754 B2
(45) Date of Patent: Jul. 12, 2011

(54) VOLTAGE MARGIN TESTING FOR PROXIMITY COMMUNICATION

(75) Inventors: Robert J. Drost, Los Altos, CA (US); Ronald Ho, Mountain View, CA (US); Justin M. Schauer, San Francisco, CA (US)

(73) Assignee: Oracle America, Inc., Redwood Shores, CA (US)

( * ) Notice: Subject to any disclaimer, the term of this patent is extended or adjusted under 35 U.S.C. 154(b) by 249 days.

(21) Appl. No.: 12/352,488

(22) Filed: Jan. 12, 2009

(65) Prior Publication Data

US 2009/0193295 A1 Jul. 30, 2009

Related U.S. Application Data

(60) Provisional application No. 61/024,832, filed on Jan. 30, 2008.

(51) Int. Cl.
*G06F 11/00* (2006.01)

(52) U.S. Cl. ............ 714/704; 714/30; 714/25; 714/712; 714/715; 714/724; 714/733; 714/734; 714/745; 714/47; 714/700; 327/51; 327/199; 327/201; 324/500; 438/107; 29/834; 385/14; 375/256; 700/114

(58) Field of Classification Search ........................ None
See application file for complete search history.

(56) References Cited

U.S. PATENT DOCUMENTS

| | | | | |
|---|---|---|---|---|
| 6,505,317 | B1 * | 1/2003 | Smith et al. | 714/738 |
| 6,916,719 | B1 * | 7/2005 | Knight et al. | 438/381 |
| 6,995,039 | B2 * | 2/2006 | Harris et al. | 438/107 |
| 7,148,074 | B1 * | 12/2006 | Drost et al. | 438/15 |
| 7,200,830 | B2 * | 4/2007 | Drost et al. | 716/12 |
| 7,712,663 | B2 * | 5/2010 | Sukegawa et al. | 235/451 |
| 7,750,709 | B1 * | 7/2010 | Schauer et al. | 327/264 |
| 2003/0086501 | A1 * | 5/2003 | Dreps et al. | 375/257 |
| 2006/0095639 | A1 * | 5/2006 | Guenin et al. | 710/310 |
| 2006/0123289 | A1 * | 6/2006 | Williams | 714/724 |
| 2007/0067115 | A1 * | 3/2007 | Canegallo et al. | 702/52 |

* cited by examiner

*Primary Examiner* — John P Trimmings
(74) *Attorney, Agent, or Firm* — Park, Vaughan, Fleming & Dowler LLP

(57) ABSTRACT

A method of testing a proximity communication system for voltage margin by impressing a voltage upon the data link between the transmitter on one chip and the receiver on the other chip coupled to the transmitter through a capacitively coupling circuit formed by juxtaposed capacitor pads on the respective two chips. The impressed voltage is varied and the output of the receiver is monitored to determine an operational voltage margin. The floating inputs on the receiver may be continuously biased by connecting them to variable biasing supply voltages through high impedances. When the floating inputs are periodically refreshed to a refresh voltage during a quiescent data period, the refresh voltage is varied between successive refresh cycles. The variable test voltage may be applied to transmitter output when it is in a high-impedance state, and the output of the receiver is measured.

13 Claims, 4 Drawing Sheets

VOLTAGE MARGIN TESTING FOR PROXIMITY COMMUNICATION

RELATED APPLICATION

This application hereby claims priority under 35 U.S.C. §119 to U.S. Provisional Application No. 61/024,832, entitled "Voltage Margin Testing for Proximity Communication," by Robert J. Drost, Ronald Ho, and Justin Schauer, filed 30 Jan. 2008.

BACKGROUND

1. Field

The present invention relates to biasing techniques in integrated circuit (IC) chips. In particular, the invention relates to testing the error margin as a function of biasing in a system that supports proximity communication.

2. Related Art

Advances in semiconductor technology presently make it possible to integrate large-scale systems, including hundreds of millions of transistors, into a single semiconductor chip. Integrating such large-scale systems onto a single semiconductor chip increases the speed at which such systems can operate because signals between system components do not have to cross chip boundaries, and are not subject to lengthy chip-to-chip propagation delays. Moreover, integrating large-scale systems onto a single semiconductor chip significantly reduces production costs because fewer semiconductor chips are required to perform a given computational task.

However, these semiconductor chips still need to communicate with each other, and unfortunately these advances in semiconductor technology have not been matched by corresponding advances in inter-chip communication technology. Semiconductor chips are typically integrated onto a printed circuit board that contains multiple layers of signal lines for inter-chip communication. However, signal lines are typically 100 to 1000 times denser on a semiconductor chip than on a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

One solution to the above problem is to replace the direct conductive coupling with direct chip-to-chip capacitive coupling, referred to as "proximity communication" (PxC). Proximity communication is an I/O technology that allows two chips in face-to-face alignment to communicate without wires as has been explained by Drost et al. in "Proximity Communication," *IEEE Journal of Solid-State Circuits*, vol. 39, no. 9, September 2004, pp. 1529-1535. In the most widely used implementation, corresponding arrays of electrode plates or pads are formed in the opposing surfaces of the two chips, which are then fixed together with a dielectric layer in between to form a large number of capacitively coupled communication links between the chips. One embodiment of a capacitively coupled communication system is illustrated in the circuit diagram of FIG. 1. A first integrated circuit chip, here called a transmit chip 10, includes a transmitter 12 as well as other integrated circuitry typical of a modern IC. A second integrated circuit chip, here called a receive chip 14, includes a receiver 16 as well as other integrated circuitry which needs to be coupled to the circuitry of the transmit chip 10. In this embodiment, the transmitter 12 and receiver 16 are differential, each having either two outputs or two inputs for usually complementary versions of the same signals. Conductive transmit pads 18A, 18B are formed in the surface of the transmit chip 10 and are connected to the differential outputs of the transmitter 12 receiving an input signal $V_{IN}$ across its differential inputs. Similarly, conductive receive pads 20A, 20B are formed in the surface of the receive chip 14 in positions to be aligned with the transmit pads 18A, 18B of the transmit chip 10. The receive pads 20A, 20B are connected to the differential inputs of the receiver 16 outputting an output signal $V_{OUT}$, which should correspond to $V_{IN}$.

Typically the pads 18A, 18B, 20A, 20B are covered with thin dielectric layers as part of their formation process. To achieve a proximity communication system, the transmit and receive chips 10, 14 are permanently or semi-permanently juxtaposed with the transmit pads 18A, 18B aligned with respective ones of the receive pads 20A, 20B with a dielectric layer between them, thereby forming two capacitive coupling circuits 22A, 22B between the two chips 10, 14 for the differential signal to be coupled between them.

However, the capacitive coupling circuits 22A, 22B provide DC isolation between the two chips 10, 14 and the high input impedance of the differential amplifier of the receiver 16 provides very little conductive discharge to ground. As a result, receiver nodes 26A, 26B receiving the capacitively coupled signals are floating relative to the transmit chip 10 and are not DC tied to the outputs of the transmitter 12. As a result, the receiver nodes 26A, 26B may suffer DC wander due to leakage and the input offset voltage of the receiver 16 subtract from any signal coupled to it across the capacitive coupling circuits 22A, 22B.

The signals coupled across a DC-isolated capacitively coupled channel can be very small, on the order of tens of millivolts. The input offset voltages in the differential amplifier associated with the receiver 16 used to receive the signals can approach the same order of signal level. Mitigating the effect of the receiver offset advantageously increases their sensitivity and performance. Some prior offset cancellation schemes add capacitance to sensitive nodes in the proximity channel to bias the nodes 26A, 26B toward desired voltage levels. Some prior art schemes dynamically refresh nodes 26A, 26B such that the nodes 26A, 26B are intermittently charged to desired voltage levels during a quiescent period of data transmission.

SUMMARY

One embodiment provides a system that enables testing of voltage margin and other circuit characteristics of a proximity communication channel having capacitive coupling between transmit and receive chips and a receiver on the receive chip having high-impedance inputs such that the receiver inputs are effectively floating.

In some embodiments, variable voltages are impressed on one or more nodes between the transmitter on the transmit chip and the receiver on the receive chip, and the output of the receiver is monitored as a function of the impressed voltage.

In some embodiments, the output of the receiver is analyzed against a sequence of data signals applied to the transmitter to determine a bit error rate (BER) of the transmission as a function of the impressed voltages.

In some embodiments, the impressed voltage or voltages are swept over a range of voltages around the nominal operating voltages.

In some embodiments involving continuously biased floating receiver inputs, the receiver inputs are coupled to bias voltages through coupling elements such as large resistance and the bias voltages are swept.

In some embodiments involving periodic refreshing of the floating inputs during cessation of data transmission, the refresh voltages during successive refresh cycles are swept.

In some embodiments, during a quiescent data period, the transmitter outputs are put into high impedance states, for example, with tri-state inventers, and known voltages are applied to one or more output nodes at the transmitter and the receiver output is monitored. The voltages may be swept over a range bracketing the nominal output voltages of the inverters during data operation.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The degree of biasing of floating input nodes is largely built into the system. That is, the hardware elements associated with the biasing are part of the fabricated chips and the voltage supply levels used in biasing the input nodes are either predetermined or difficult to vary between chips of different designs. Furthermore, in fielded systems, the voltages of power supplies can vary during operation. However, the degree of biasing the input nodes partially determines the signals entering the circuitry through the receiver 16. During chip development, it would be desirable to determine the margin for the biasing voltage outside of which the received signal becomes unacceptably degraded. The characterization of the operating voltage margin of communicated signals for proximity communication is critical during system bring-up to compare simulation and analytic models with measurements to aid the debugging. It would also be useful to monitor the margins during normal operation to anticipate and correct potential problems before they occur. If voltage margins cannot be accurately measured, it will be difficult to productize proximity communication.

Figure 1:
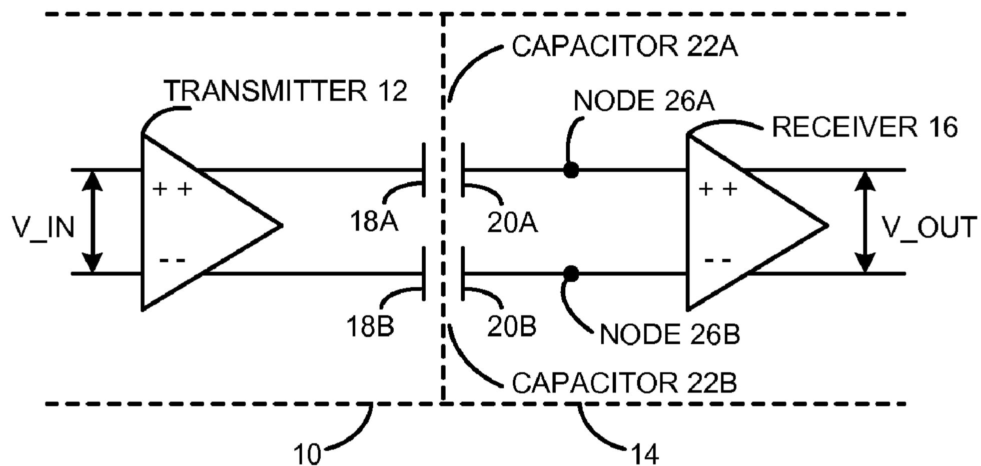
FIG. 1 is a schematic circuit diagram of a proximity communication channel.

Schauer, Hopkins, and Drost have described one biasing method in U.S. patent application Ser. No. 12/394,011, filed 6 Jan. 2009, and entitled "Offset Cancellation for DC Isolated Nodes." As illustrated in the circuit diagram of FIG. 2, the transmit chip 10 includes two inverters 30A, 30B receiving complementary signals datap, datan. The inverters 30A, 30B may represent the output amplifiers of the differential transmitter 12 of FIG. 1. Their inverted outputs are coupled across the capacitive coupling circuits 22A, 22B respectively to the negative and positive inputs of a differential receiver 32 on the receive chip 14. The differential receiver 32 in this representation has a single output Rxdata, which is the data signal used on the receive chip 14. The receiver 32 can easily be generalized to a bipolar receiver having complementary outputs. The floating input nodes 26A, 26B are biased by being connected through large resistances 32A, 32B to respective bias supply voltages biasn, biasp. The high-impedance resistors 32A, 32B are preferably greater than 1 gigaohm ($10^9$ ohm) and less than 1000 gigaohm and may be formed by resistors, weak pass transistors, or leakage through parasitic leakage paths of off transistors. In operational chips, the power supply nodes supplying the bias supply voltages biasn, biasp are connected to two internal power buses which are considered to have fixed voltages. However, in practicing some aspects of the invention especially during system development, the nodes are externally accessible to provide variably controlled and known values of the bias supply voltages biasn, biasp. Alternatively, internal digital-to-analog converters may generate a range of bias supply voltages biasn, biasp based on digital commands issued to them.

Figure 2:
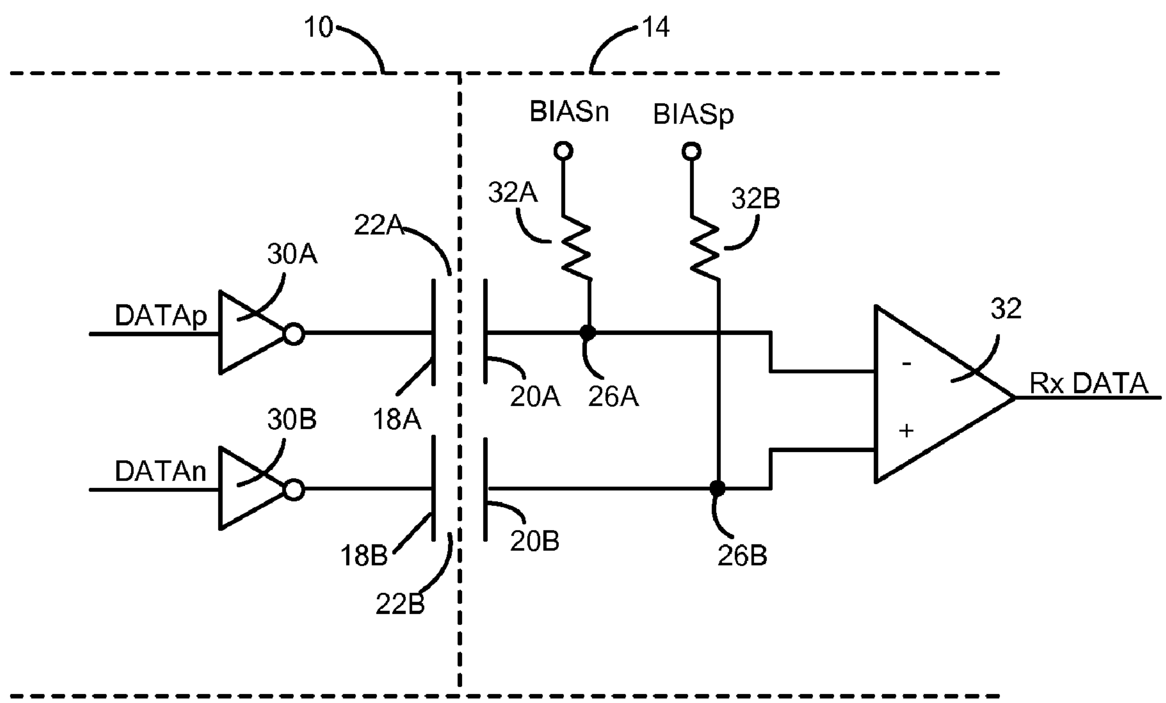
FIG. 2 is a schematic circuit diagram of a proximity communication channel in accordance with an embodiment of the invention utilizing continuous biasing of the floating receiver inputs.
Figure 3:
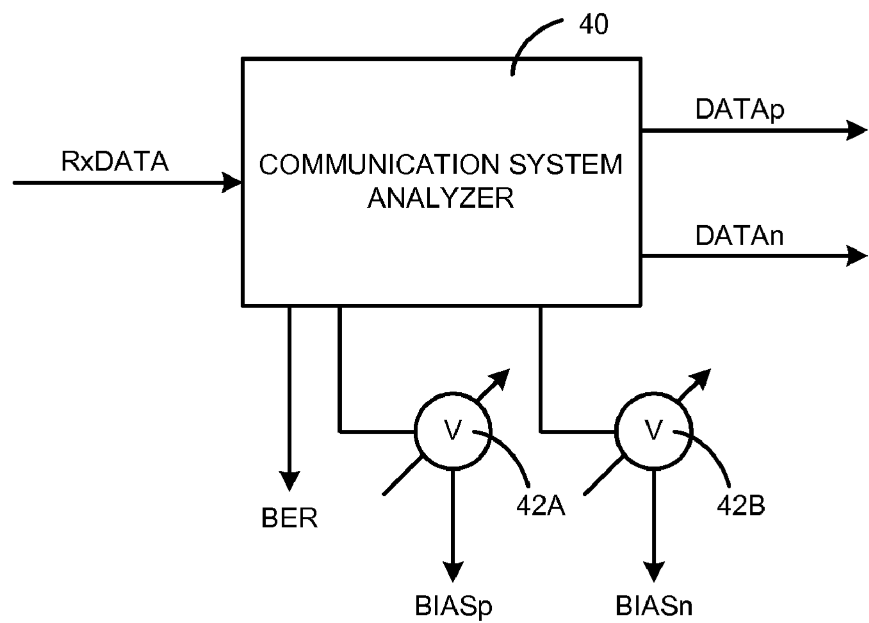
FIG. 3 is a schematic diagram of testing apparatus in accordance with an embodiment of the invention usable for testing the proximity communication channel of FIG. 2.

Voltage margins may be determined by connecting the PxC circuit of FIG. 2 to a communication system analyzer 40 of FIG. 3. The analyzer produces a digital data stream of 1 and 0 data signals, usually pseudo-random but having a specified run limit or unbalance limit of 1s and 0s to prevent excessive signal charging of floating nodes. The analyzer 40 supplies directly or indirectly the transmit data signals datap, datan on the transmit chip 10. The receiver 32 on the receive chip 14 receives through its floating input nodes 26A, 26B the signals corresponding to datap, datan and outputs the corresponding signal Rxdata. The Rxdata signal is coupled back to the analyzer 40, which determines if the received signal Rxdata is the same as the data datap, datan it transmitted. The data are usually compared bit by bit. Any bit received as the wrong polarity is counted as an error. Over a long data stream, the analyzer determines a bit error rate BER. Communication systems are typically designed to accommodate a maximum bit error rate. If the BER is too high, the system is not working acceptably and must be redesigned or adjusted.

The communication system analyzer or auxiliary equipment of this embodiment of the invention also provides the capability of controlling the biasing voltages produced by two DC power supplies 42A, 42B producing the bias supply voltages biasp, biasn of FIG. 2. According to an embodiment of the invention, the bit error rate is measured for different values of the bias supply voltages biasp, biasn to determine the voltage margin beyond which the BER exceeds a predetermined limit. During voltage margin testing, a differential voltage may be introduced by shifting biasp and biasn in opposite directions from their design values or by a mixed common-mode and differential voltage biasing in which only one of biasp or biasn is shifted. Shifting only one bias voltage is simpler to implement and can be acceptable if the bipolar receiver provides a high common-mode rejection ratio.

It is understood that the invention can be practiced with equipment and methods other than the testing equipment of FIG. 3. The signal generation may be performed with an analyzer outputting a value of the BER while separate equipment is varying the bias voltages biasp, biasn and tracking the measured BER with changes in these voltages.

Figure 4:
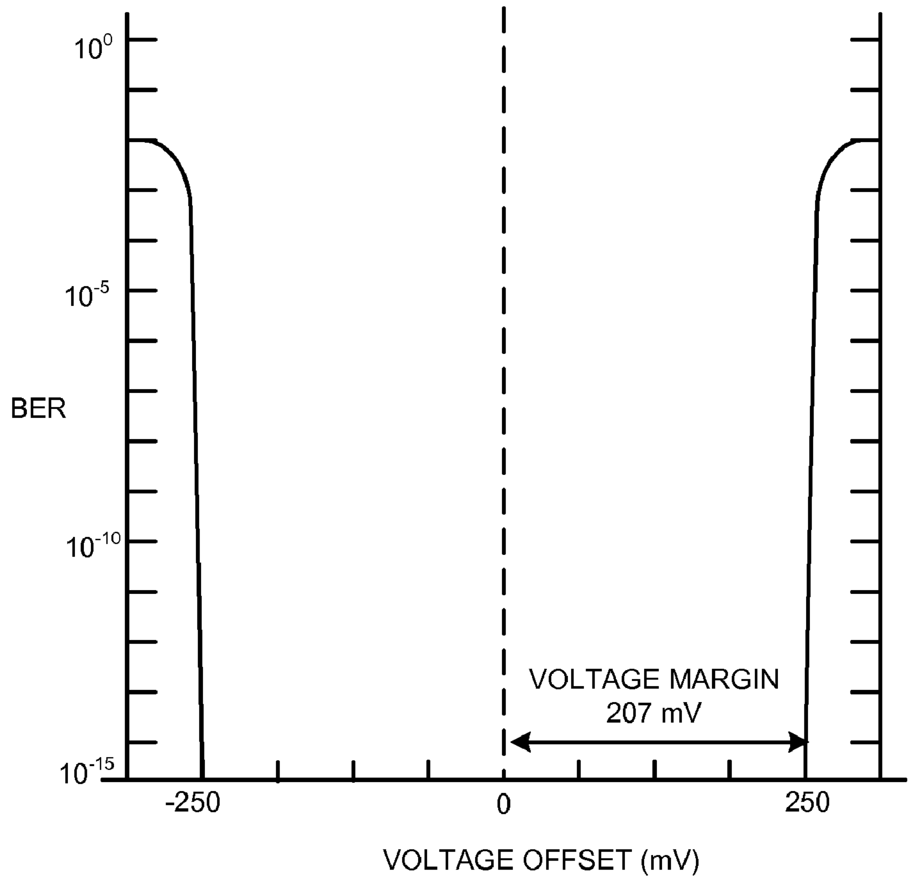
FIG. 4 is a chart exhibiting a voltage margin measured for the proximity communication channel of FIG. 2.

Such a system was tested by offsetting one of the bias voltages from its nominal value in both directions in a PxC system operating at 1.60 Gb/s. The results from the test illustrated in the graph of FIG. 4 demonstrate that, if a BER of $10^{-14}$ is considered acceptable, the voltage margin from its nominal zero value is over 200 mV in both the positive and negative directions. If such a voltage margin is not acceptable, the system needs to be redesigned or adjusted.

In an alternative method of correcting offset in receivers in proximity communication systems, the capacitively coupled input nodes float during data transmission but are periodically refreshed to a desired voltage while the data transmission is halted. In an embodiment of the invention, the refresh voltages are swept during testing to establish the voltage margin. As illustrated in the circuit diagram of FIG. 5, the input nodes 26A, 26B of a refreshed receiver 32 float during data transmission but, as previously described, are subject to voltage offset because they are capacitively coupled through the capacitive coupling circuits 22A, 22B to the signals driving them. However, periodically during a refresh cycle while data is not being transmitted, a receive refresh signal RxRefresh causes switches 50A, 50B to close, thereby connecting the input nodes 26A, 26B through a low resistance path to receiver refresh voltages RxRefn and RxRefp. The input nodes 26A, 26B quickly assume these voltages, and the receiver refresh signal RxRefresh is reversed to cause the switches 50A, 50B to open. Thereby the input nodes 26A, 26B are left floating initially at the refreshed voltages RxRefn and RxRefp. Data transmission then resumes and the input nodes 26A, 26B and the inputs of the receiver 32 are driven by the transmitter on the transmit chip 10. The refreshing is repeated every refresh period, which is chosen to be often enough to prevent excessive offset from developing on the input nodes 26A, 26B but infrequently enough to prevent excessive reduction in effective bandwidth of the transmitted signal. In normal operation of data transmission, the receiver biasing voltages Rbiasn and Rbiasp are set to optimize the power and delay of the receiver 32 or alternatively to cancel the inherent offset voltages of the receiver.

Figure 6:
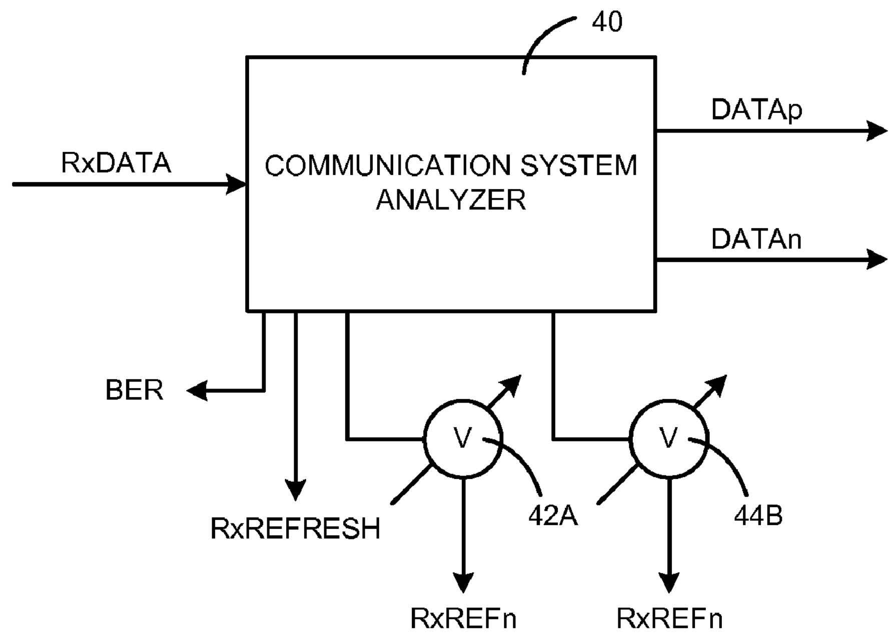
FIG. 6 is a schematic diagram of testing apparatus in accordance with an embodiment of the invention usable for testing the proximity communication channel of FIG. 5 in accordance with an embodiment.

In one embodiment of the invention, the receiver refresh voltages are swept during testing to establish the voltage margin. However, in view of the periodic nature of the normal refreshing, a discrete voltage of desired shift is imposed on the refresh voltages RxRefn and RxRefp during each refresh cycle during the testing. The testing apparatus, illustrated in the block diagram of FIG. 6, is similar to that of FIG. 3, but the communication system analyzer 40 includes an additional output for the refresh signal RxRfresh. During the phase of testing to measure the bit error rate BER, the refresh signal RxRefresh is not enabled. However, during a refresh cycle, the refresh signal RxRefresh is enabled, and the communication system analyzer 40 controls the two DC voltage supplies 42A, 42B to produce the desired refresh voltages RxRefn and RxRefp for the next cycle of BER testing. If desired to accumulate sufficient data for dependable bit error rates, the same refresh voltages RxRefn and RxRefp may be imposed over multiple refresh periods.

The refresh voltages RxRefn and RxRefp may be varied together in a differential or a common-mode variation or they may be varied individually for a single-ended test, analogously to the options with the continuously biased PxC system of FIG. 2. The sweep measures parameters, such as the offset voltage of the receiver and the amplitude of the input signal.

Figure 5:
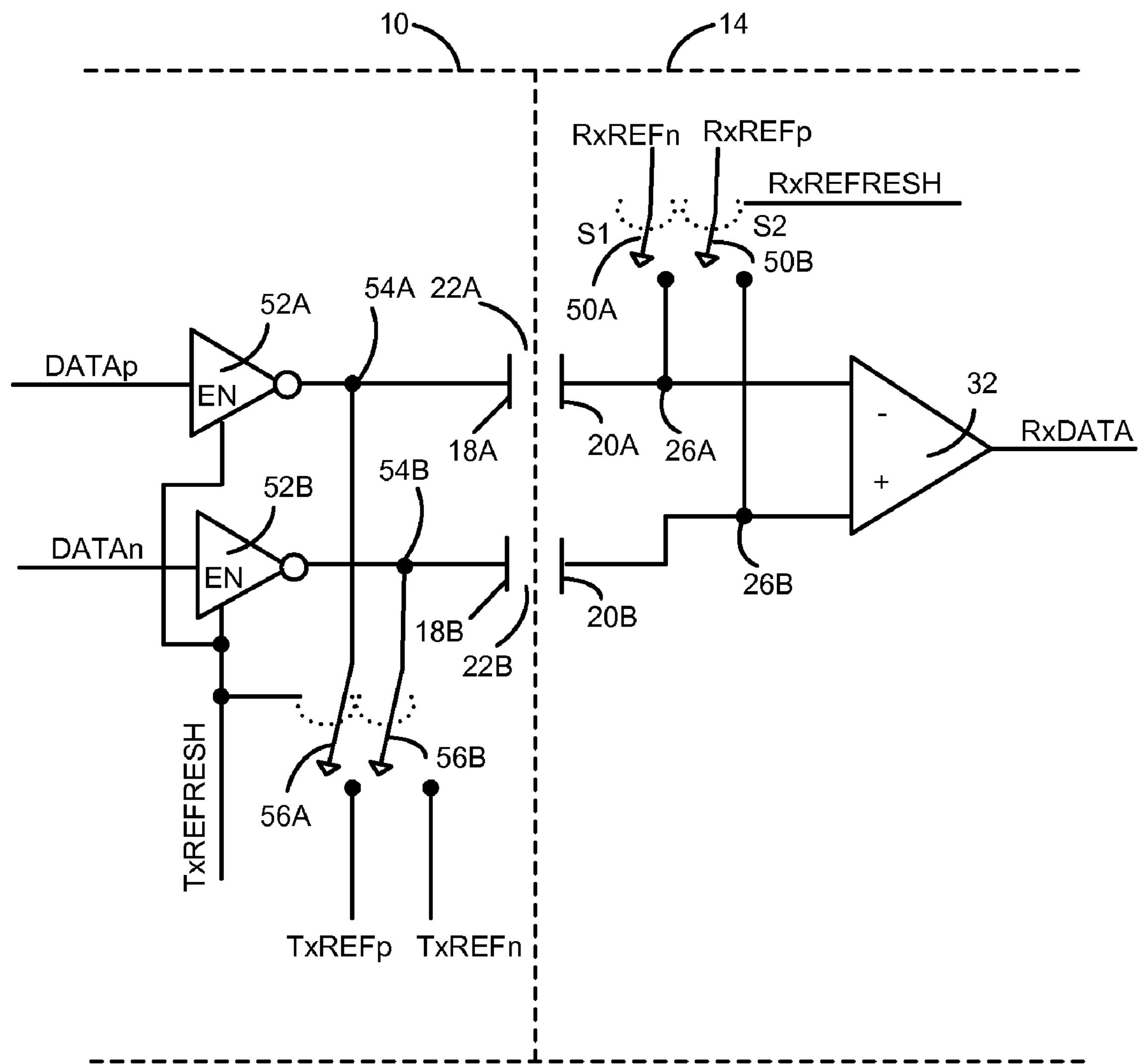
FIG. 5 is a schematic circuit diagram of a proximity communication channel in accordance with another embodiment of the invention utilizing refreshed biasing of the floating receiver inputs.

If only receiver refreshing is being tested, the transmit chip 10 driving the receive chip 14 may be the transmit chip 10 illustrated in FIG. 2. However, in another aspect of the invention, the voltage margin of the transmitter may be tested. In another embodiment of the invention, as also illustrated in FIG. 5, the transmitter on the transmit chip 10 includes two tri-state inverters 52A, 52B having enable inputs en driven by a transmit refresh signal TxRefresh to select between the data states and the high-impedance state on the inverter outputs. The tri-state inverters have three output states, high and low voltage levels corresponding to the two data levels and a high-impedance state. When the output is in its high-impedance state and a voltage supply is externally connected to the inverter's output, the voltage on the output is determined by the voltage supply and is not significantly affected by whatever voltage is output by the tri-state inverter. Output nodes 54A, 54B positioned between the tri-state inverters 52A, 52B and the capacitive coupling circuits 22A, 22B are selectively connected to transmission refresh voltages TxRefn and TxRefp through switches 56A, 56B. The transmission refresh signal TxRefresh opens the switches 56A, 56B when it enables the tri-state inverters 52A, 52B to enable data transmission and closes the switches 56A, 56B when it disables the tri-state inverters 52A, 52B during the voltage testing.

During the voltage testing, the transmission refresh voltages TxRefn and TxRefp are imposed on the transmit side of the capacitive coupling circuits 22A, 22B instead of the data signals datap and datan, and corresponding coupled signals are received by the differential receiver 32. The receiver 32, in turn, during testing outputs the output signal Rxdata based upon the difference between its input signals derived from the transmission refresh voltages TxRefn and TxRefp. It is understood that varying the refresh voltages TxRefn and TxRefp on the transmitter outputs includes varying the voltage to more levels than the two nominal data levels associated with the two data states, for example, to at least three levels.

During normal operation outside of testing, the average voltages developed by the data stream on the output nodes 54A, 54B would be the average of the high and low signal voltages during data transmission, assuming balanced coding for the data. During testing, one or both of the transmit refresh voltages TxRefn and TxRefp are swept over a range of output voltages expected in normal operation of the tri-state inverters to analyze the voltage margin versus the amplitude of the transmit signals output by the tri-state inverters 52A, 52B. Similarly to the other voltage sweeps, the transmitter refresh voltages TxRefn and TxRefp may be swept together, either differentially or in common-mode variation, or may be separately swept.

Figure 7:
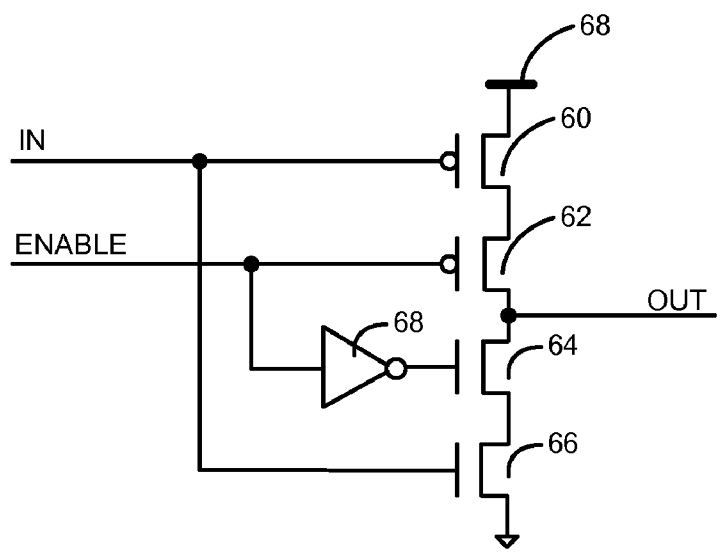
FIG. 7 is a schematic diagram of a tri-state inverter usable with the proximity communication channel of FIG. 5.

The switches 50A, 50B, 56A, 56B may be implemented using NMOS, PMOS or CMOS pass gates. The tri-state inverters 52A, 52B may be implemented, as illustrated in the circuit diagram of FIG. 7, with first and second PMOS transistors 60, 62 and first and second NMOS transistors 64, 66 serially arranged across their sources and drains between a positive power supply voltage 68 and ground. The input signal IN to the tri-state inverter is applied to the gates of the first PMOS transistor 60 and the second NMOS transistor 66. The enable signal Enable is applied to the gate of the second PMOS transistor 62 and through an inverter 68 to the gate of the first NMOS transistor 64. The output signal Out of the tri-state inverter is taken from between the second PMOS transistor 62 and the first NMOS transistor 64. As a result, in the presence of a low Enable signal, the second PMOS and NMOS transistors 62, 66 are turned on and the Out signal is the inverse of the In signal. However, in the presence of a high Enable signal, the second PMOS and NMOS transistors 62, 66 are turned off and the node associated with the Out signal assumes a high-impedance state.

The voltage margin testing of the invention relies upon the pre-existing receiver on the receive chip 14 used in operational data transmission. As a result, the experimentally determined voltage margin is more accurate than if additional circuitry bypassing the receiver is used for testing.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method of testing a proximity communication circuit comprising a first chip including a data transmitter and one or more first capacitor pads connected to one or more data outputs of the data transmitter, and a second chip including a data receiver and one or more second capacitor pads connected to one or more data inputs of the data receiver, wherein the first and second chips are juxtaposed with the first capacitor pads aligned with respective ones of the second capacitor pads with dielectric therebetween to form capacitive coupling circuits between the first and second chips, and to form respective data links between the data outputs of the data transmitter and the data inputs of the data receiver, the method comprising the steps of:

impressing and varying at least one test voltage of predetermined amplitude upon at least one respective node on respective ones of the data links; and monitoring the output of the data receiver as a function of the varying test voltage;

wherein each of the data inputs of the data receiver is periodically refreshed by a respective refresh supply voltage applied to the data input during a quiescent period of data transmission, and wherein the impressing and varying step varies the refresh supply voltage between successive ones of the quiescent period.

2. The method of claim 1, wherein the monitoring includes applying a sequence of predetermined data signals to the data transmitter and comparing the output of the data receiver to the predetermined data signal to determine an error rate.

3. The method of claim 2, wherein the data transmitter includes two differential outputs and the data receiver includes two differential inputs.

4. The method of claim 3, wherein the impressing and varying step concurrently varies biasing supply voltages applied to the differential inputs in opposite directions.

5. The method of claim 3, wherein the impressing and varying step concurrently varies biasing supply voltages applied to the differential inputs in the same direction.

6. The method of claim 3, wherein the monitoring includes applying a sequence of predetermined data signals to the data transmitter and comparing the output of the data receiver to the predetermined data signal to determine an error rate.

7. The method of claim 1, wherein each of the data inputs of the data receiver is continuously biased by a respective biasing supply voltage connected to the data input through a respective resistance, and wherein the impressing and varying step varies the biasing supply voltage.

8. The method of claim 1, wherein the monitoring includes applying a sequence of predetermined data signals to the transmitter and comparing the output of the receiver to the predetermined data signal to determine an error rate.

9. The method of claim 1, wherein the data outputs of the transmitter are tri-state outputs selectable between two data voltage levels and a high-impedance state, wherein the impressing step and varying step includes impressing a voltage on the data output while the data output is in a high-impedance state, and wherein the monitoring step includes observing a voltage of the output of the receiver.

10. A method of testing a proximity communication circuit comprising a first chip including a data transmitter having two complementary data outputs and two first capacitor pads respectively connected to the two data outputs by two first links, and a second chip including a data receiver having two differential data inputs and one or more second capacitor pads connected to the two data inputs by two second links, wherein the first and second chips are juxtaposed with the first capacitor pads aligned with respective ones of the second capacitor pads with dielectric therebetween to form two capacitive coupling circuits between the first and second chips, the method comprising the steps of:

for a given set of links, impressing and varying two test voltages of predetermined amplitudes upon two nodes on respective ones of the given set of links, wherein the given set of links includes at least one of the first links and the second links; and monitoring the output of the data receiver as a function of the varying test voltages;

wherein the data inputs are periodically set to respective refresh voltages during a quiescent period of data transmission, and wherein the test voltages are the refresh voltages during the quiescent period and the test voltages are varied between successive ones of the quiescent periods.

11. The method of claim 10, wherein the data inputs are connected to respective biasing voltages through respective resistances of at least one gigaohm and wherein the test voltages are the biasing voltages.

12. The method of claim 10, wherein the data transmitter data outputs are tri-state outputs which may be selectively put into high-impedance states, and wherein the impressing and varying step impresses the test voltages on the first links while the data outputs are in the high-impedance states.

13. The method of claim 12, wherein the monitoring step includes measuring a voltage margin on a data output of the receiver.

* * * * *